(12) United States Patent
Zhang et al.

(10) Patent No.: US 10,784,188 B2
(45) Date of Patent: *Sep. 22, 2020

(54) METHODS AND APPARATUS FOR A SEMICONDUCTOR DEVICE HAVING BI-MATERIAL DIE ATTACH LAYER

(71) Applicant: TEXAS INSTRUMENTS INCORPORATED, Dallas, TX (US)

(72) Inventors: Rongwei Zhang, Plano, TX (US); Vikas Gupta, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/443,653

(22) Filed: Jun. 17, 2019

(65) Prior Publication Data
US 2019/0304881 A1 Oct. 3, 2019

Related U.S. Application Data

(60) Continuation of application No. 15/973,828, filed on May 8, 2018, now Pat. No. 10,366,944, which is a
(Continued)

(51) Int. Cl.
*H01L 23/495* (2006.01)
*H01L 23/00* (2006.01)
*H01L 21/48* (2006.01)

(52) U.S. Cl.
CPC .... *H01L 23/49513* (2013.01); *H01L 21/4853* (2013.01); *H01L 21/4867* (2013.01); *H01L 23/49541* (2013.01); *H01L 24/27* (2013.01); *H01L 24/29* (2013.01); *H01L 24/32* (2013.01); *H01L 24/743* (2013.01); *H01L 24/83* (2013.01); *H01L 24/45* (2013.01); *H01L 24/85* (2013.01); *H01L 24/92* (2013.01); *H01L 2224/05554* (2013.01); *H01L 2224/05624* (2013.01); *H01L 2224/27318* (2013.01);
(Continued)

(58) Field of Classification Search
CPC ............ H01L 21/4853; H01L 21/4867; H01L 23/49513; H01L 23/49541; H01L 24/27; H01L 24/743; H01L 24/32; H01L 24/29; H01L 24/83
USPC ......................................... 257/676
See application file for complete search history.

(56) References Cited

U.S. PATENT DOCUMENTS 4,903,118 A * 2/1990 Iwade .................... H01L 24/83
257/783
5,629,566 A 5/1997 Doi et al.
(Continued)

*Primary Examiner* — Luan C Thai
(74) *Attorney, Agent, or Firm* — Rose Alyssa Keagy; Charles A. Brill; Frank D. Cimino

(57) ABSTRACT

Described examples include a device including a semiconductor die having a first surface with bond pads and an opposite second surface attached to a substrate by an adhesive layer covering at least a portion of the surface area of the second surface. The adhesive layer includes first zones composed of a first polymeric compound and adding up to a first portion of the surface area, and second zones composed of a second polymeric compound and adding up to a second portion of the surface area, the first zones and the second zones being contiguous. The first polymeric compound has a first modulus and the second polymeric compound has a second modulus greater than the first modulus.

15 Claims, 8 Drawing Sheets

Related U.S. Application Data division of application No. 15/470,486, filed on Mar. 27, 2017, now Pat. No. 10,083,896.

(52) U.S. Cl.
CPC ............... *H01L 2224/2919* (2013.01); *H01L 2224/2929* (2013.01); *H01L 2224/29339* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/48465* (2013.01); *H01L 2224/73265* (2013.01); *H01L 2224/83192* (2013.01); *H01L 2224/83194* (2013.01); *H01L 2224/83855* (2013.01); *H01L 2224/83951* (2013.01); *H01L 2224/85203* (2013.01); *H01L 2224/92247* (2013.01); *H01L 2924/07811* (2013.01); *H01L 2924/181* (2013.01)

(56) References Cited

U.S. PATENT DOCUMENTS

| | | | |
|---|---|---|---|
| 5,959,362 A | | 9/1999 | Yoshino |
| 6,040,631 A | * | 3/2000 | Dibble .................. H01L 24/83 |
| | | | 257/783 |
| 6,081,038 A | | 6/2000 | Murayama |
| 7,485,496 B2 | | 2/2009 | Chien et al. |
| 7,972,905 B2 | | 7/2011 | Wainerdi et al. |
| 8,614,118 B2 | | 12/2013 | Haji et al. |
| 8,841,776 B2 | | 9/2014 | Nishimura et al. |
| 9,233,389 B2 | | 1/2016 | Grueter et al. |
| 9,287,233 B2 | | 3/2016 | Chen et al. |

\* cited by examiner

US 10,784,188 B2

METHODS AND APPARATUS FOR A SEMICONDUCTOR DEVICE HAVING BI-MATERIAL DIE ATTACH LAYER

CROSS REFERENCE TO RELATED APPLICATION

This application is a Continuation of and claims priority to U.S. patent application Ser. No. 15/973,828 (TI-77199.1), filed on May 8, 2018, which is a divisional of and claims priority to U.S. patent application Ser. No. 15/470,486 (TI-77199), filed on Mar. 27, 2017 and now U.S. Pat. No. 10,083,896, grant date of Sep. 25, 2018, the entirety of all is incorporated herein by reference.

TECHNICAL FIELD

This disclosure relates generally to the field of semiconductor devices and processes, and more specifically to the structure and fabrication method of packaged semiconductor devices.

BACKGROUND

The dramatic increase of the world market price for gold compared to other metals stimulated the semiconductor device industry to develop copper wire ball bonding as a replacement of gold wire ball bonding. While copper is a welcome bond wire material because it has about 30% higher electrical conductivity when compared to gold, use of copper bond wires requires the formation of intermetallics with aluminum bond pads for strong and reliable ball bonds. The need for the intermetallic formation necessitates the use of higher temperatures during the copper wire bonding process, when compared to the prior gold wire bonding processes. For copper wire ball bonding, temperatures above 220° C. and more typically in the range of about 250° C. are needed, while for gold, temperatures in the range of 180° C. are sufficient. At these higher process temperatures, the elasticity modulus of the adhesive polymeric materials used for the die attach layer between the back side of the semiconductor die and a substrate decreases, causing a risk of non-stick-on-pad (NSOP) defects. This NSOP issue can be affected with limited success by optimizing the curing profile of an adhesive polymeric material. If the modulus of the adhesive polymeric material is high at high temperatures, then the material may be at risk of delamination during stress tests. Such stress tests involve, for instance, repeated temperature cycles from −65° C. to +150° C., or 1000 hr storage at 85° C. and 85% relative humidity and while applying an electric bias to the packaged device.

While polymeric materials such as polyimides and epoxies are insulators, many integrated circuit device types require adhesive die attach materials that provide electrical and/or thermal conductivity. Consequently, many die attach materials, such as silver epoxy, include a metallic filler such as silver. In the electric field of a direct current (DC), for instance between an anodic die pad and a nearby cathodic bond pad, the silver filled epoxy can undergo dissolution in the presence of moisture, creating positive silver ions. In the presence of an adsorbed water layer acting as an electrolyte, the positive silver ions can migrate in the DC electric field from the anodic die pad to the cathodic bond pad, where the ions are reduced to pure silver and eventually form a dendrite tree that can cause an electrical short between anode and cathode. Improvements are therefore desirable.

SUMMARY

In a described example, a device includes a semiconductor die having a first surface with bond pads and an opposite second surface attached to a substrate by an adhesive layer covering at least a portion of a surface area of the second surface. The adhesive layer includes first zones composed of a first polymeric compound and adding up to a first portion of the surface area, and second zones composed of a second polymeric compound and adding up to a second portion of the surface area, the first and second zones are contiguous. In one example, the first polymeric compound has a first modulus and the second polymeric compound has a second modulus greater than the first modulus. In another example, the first polymeric compound includes metallic fillers, and the second polymeric compound is substantially free from the metallic fillers.

DETAILED DESCRIPTION OF THE EXAMPLE EMBODIMENTS

Corresponding numerals and symbols in the different figures generally refer to corresponding parts unless otherwise indicated. The figures are not necessarily drawn to scale. Following common practice, the parameter describing the elastic behavior of materials, the elasticity modulus, is often referred to herein in abbreviated fashion as modulus.

In an embodiment of a semiconductor device with an integrated circuit die, the adhesive layer for attaching the die is composed of distinct and contiguous zones made of different materials. As used herein, the term "zone" refers to a fraction of the layer composed of only one type of material. The first zones include a first polymeric compound with a first modulus, and the second zones include a second polymeric compound with a second modulus greater than the first modulus. A layer of such composition is referred to herein as a bi-material layer. Examples of described devices use a bi-material die attach layer as the adhesive layer with a certain area to attach a semiconductor die to a substrate. The surface area of the die determines the area of the attach layer. The area of the die attach layer includes a first area portion composed of the sum of the first zones, and a second area portion composed of the sum of the second zones. In the embodiment, the second zones are distributed to locations which correspond to (or mirror-image) the locations of the die bond pads on the die top surface. Consequently, the second area portion, as the sum of the second zones, may be smaller than the first area portion as the sum of the first zones. In an embodiment, copper ball bonds are attached to the die bond pads; the copper wire bonding process uses temperatures of about 250° C. and applies mechanical pressure onto the semiconductor die in order to attach the balls of wire bonds.

In another embodiment, a metallic filler is added to the first polymeric compound, while the second polymeric compound is essentially free of metallic fillers. The second zones of the second and filler-free compound are distributed to locations where a metallic dendrite from the adhesive bi-material die attach layer to a bond pad could grow along the gradient of an electric field, if the metallic fillers (and moisture) were available. The use of these embodiments reduces the risk of metallic dendrite forming and possibly causing a short.

Figure 1:
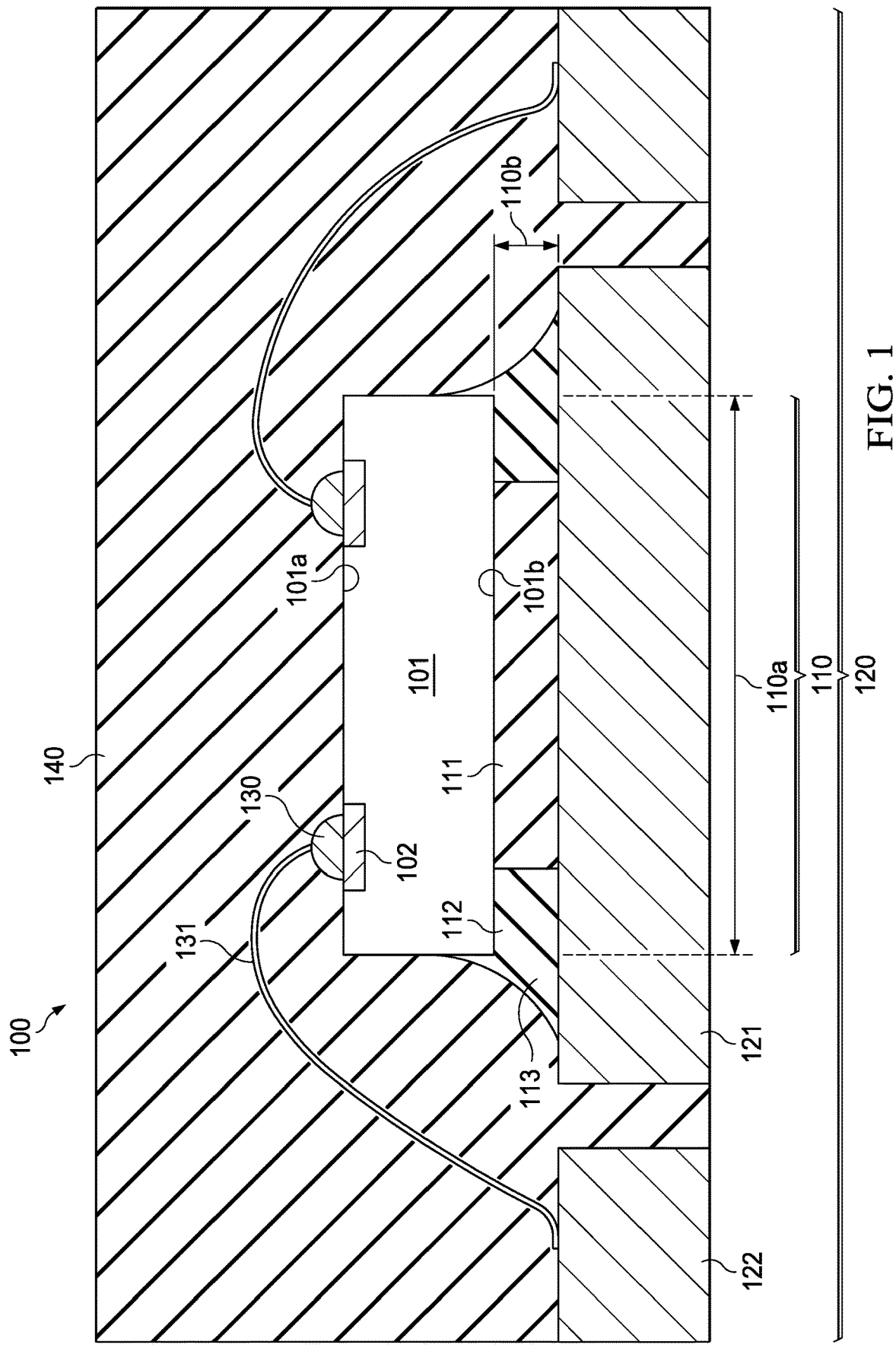
FIG. 1 illustrates a cross section of an embodiment for a packaged integrated circuit having a bi-material die attach layer connecting a semiconductor die to a leadframe.

FIG. 1 illustrates an example embodiment with an adhesive layer, a bi-material die attach layer, attaching a semiconductor die to a substrate in a packaged integrated circuit device 100. In FIG. 1, the semiconductor die 101 has a first surface 101a, which includes a plurality of circuitry terminals configured as bond pads 102. Die 101 is commonly silicon, but may be any other semiconductor material such as gallium nitride and can include epitaxial layers as the semiconductor material. Opposite first surface 101a is second surface 101b. The area of second surface 101b adheres to bi-material die attach layer 110 having thickness 110b and length 110a. The bi-material die attach layer 110 is adhesive. The embodiments are also applicable to examples where the device is not a monolithic integrated circuit but the embodiment includes a device attached to a substrate.

The adhesive bi-material die attach layer 110, in turn, is adhering to substrate 120, which, in the case of device 100, is a metallic leadframe with die support pad 121 and leadframe leads 122. In other devices, substrate 120 may be a carrier laminated of several layers of metal and insulators, or any organic substrate. For the device of FIG. 1, leadframe leads 122 are shaped as flat leads used in Quad Flat No-Lead (QFN) devices or in Small Outline No-Lead (SON) devices; in other devices that can be used with the embodiments, the leads may be shaped as cantilevered leads. The bond pads 102 of semiconductor die 100 have a metallurgy suitable for copper wire ball bonding; FIG. 1 shows copper balls 130 attached to bond pads 102 and copper wires 131 attached to leadframe leads 122 by stitch bonds. The device 100 is encapsulated in a plastic package preferably employing an encapsulation material 140 of epoxy-based molding compound with inorganic fillers. Other molding compounds for integrated circuit packages can be used.

As FIG. 1 indicates, bi-material die attach layer 110 includes one or more first zones 111 and one or more second zones 112; first zones 111 and second zones 112 are contiguous. In the example of FIG. 1, first zones 111 are composed of a first polymeric compound having a first modulus. The sum of the first zones 111 are in contact with surface 101b of semiconductor die 101. Second zones 112 are composed of a second polymeric compound having a second modulus greater than the first modulus. Due to the assembly process employed (see FIG. 6B), the second polymeric compound may form a meniscus 113 extending from die support pad 121 to some height along the die sidewalk.

As a materials characteristic, the elasticity modulus E [measured in pascal, Pa], or in brief the modulus E [Pa], is related to stress σ [Pa] and strain ε by the relation of Equation 1:

$$E[\text{Pa}] = \sigma[\text{Pa}]/\varepsilon \tag{1}$$

The modulus E is temperature dependent; it decreases with increasing temperature. As an example, the modulus of polymeric materials used in semiconductor technology may drop an order of magnitude, or more, from room temperature to the higher temperatures needed for wire ball bonding.

In semiconductor technology, semiconductor dies are attached to substrates at room temperature, polymerized at elevated temperature (in an example process, a 30 min ramp from 25° C. to 175° C., hold at 175° C. for 1 hour, and then cool down to room temperature), and then brought to the temperature of wire bonding. While the wire ball bonding temperature is in the range of about 180° C. for traditional gold wires, for copper bond wires a temperature of >220° C., preferably in the range of 250° C., is increasingly used. Materials used as die attach compounds for attaching semiconductor dies to substrates are categorized as low modulus materials when E<100 MPa at the wire bonding temperature, and as high modulus materials when E>200 MPa at the wire bonding temperature.

For stress-sensitive semiconductor devices such as Bulk Acoustic Wave (BAW) devices and some Micro-Electro-Mechanical Systems (MEMS), the die attach materials preferably exhibit low modulus values at the wire ball bond temperatures. Investigations by Applicants have demonstrated that in the assembly of semiconductor devices, where the modulus E of the die attach materials is low at the wire bonding temperature, semiconductor dies have a tendency to show NSOP defect issues and can fail wire bonding.

In the embodiment of FIG. 1, the first modulus of the first polymeric compound for the first zones 111 belongs to the regime of low modulus (<100 MPa at wire bonding temperature), and the second modulus of the second polymeric compound for the second zones 112 belongs to the regime of high modulus (>200 MPa at wire bonding temperature). As mentioned hereinabove, the first and the second compound are adhesive, and the first and second zones 111 and 112 are contiguous. The first and second adhesive compounds are commercially available from the companies Henkel, Germany, and Sumitomo, Japan.

As mentioned, first zones 111 add up to a first portion of the surface area of second die surface 101b, and second zones 112 add up to a second portion of the surface area. In the example device of FIG. 1, the second portion is smaller than the first portion; in other device examples, it may be the reverse. Furthermore, in the example of FIG. 1, the second zones 112 are distributed to locations of the bi-material die attach layer 110 that correspond to locations of bond pads 102 on the first die surface 101a. Consequently, the attachment process of the free air balls during the wire bonding process with the necessary mechanical pressure and ultrasonic agitation of the bonder tool capillary is supported by the stiffer characteristic of the second polymeric compound (see process flow described hereinbelow), while the compliant characteristic of the first polymeric compound remains available for protecting the stress-sensitive circuitry of die 101.

For devices which need enhanced electrical and thermal conductivity from the semiconductor die to the metallic substrate pad, it is advantageous to include metallic fillers (such as silver particles) in the first polymeric compound forming zones 111, while the second polymeric compound forming zones 112 (and meniscus 113) remains essentially free of metallic fillers. This separation of the metallic filler from certain areas will prevent the formation of metallic dendrite trees (such as silver dendrites) as a result of metal migration along a die side wall towards the die top during biased highly accelerated stress tests (BHAST).

FIGS. 3A thru 7 illustrate steps of the fabrication process flow of an embodiment semiconductor device incorporating an adhesive die attach layer including a first and a second polymeric compound. The process flow starts by providing a substrate for the device. When the substrate is a leadframe as illustrated in the example 320 of FIG. 3A with cross section shown in FIG. 3B, such leadframe is preferably etched or stamped from a thin sheet of base metal such as copper, copper alloy, iron-nickel ahoy, aluminum, Kovar™, and others, in a typical thickness range from 120 to 250 µm. As used herein, the term base metal has the connotation of starting material and does not imply a chemical characteristic. Some leadframes may have additional metal layers plated onto the complete or the partial surface areas of the base metal, examples are; nickel; palladium; and gold layers on leadframes. Materials used for coating leads for improving wire bond reliability such as electroless nickel/immersion gold (ENIG) and electroless nickel, electroless palladium, immersion gold (ENEPIG) can be used. Commercially available leadframes are sometimes referred to as "preplated" leadframes when these coatings are provided by a leadframe vendor. Alternatively these coatings can be added by electroless or electroplating in a prior process step (not shown).

A leadframe provides a stable die support pad (321 in FIG. 3A) for firmly positioning a semiconductor die. In the example leadframe of FIG. 3A, die support pad 321 has rectangular shape. Further, a leadframe offers a multitude of conductive leadframe leads 322 to bring various electrical conductors into close proximity of the die. Any remaining gap between the tip of the leads and the die terminals will typically be bridged by thin bonding wires (see FIG. 1); alternatively, in flip-chip technology the die terminals may be connected to the leads by metal bumps. For the leadframe, the desired shape of pad, leads, and other geometrical features can be etched or stamped from the original metal sheet.

The leadframe characteristics should facilitate reliable adhesion to attached die and to packaging compounds. Besides chemical affinity between the molding compound and the metal finish of the leadframe, reliable adhesion may be increased by increasing leadframe surface roughness. This can be particularly helpful in view of the technical trend of shrinking package dimensions, which offers less surface area for adhesion. The increasing use of lead-free solders pushes the solder reflow temperature range into the neighborhood of about 250° C., making it more difficult to maintain mold compound adhesion to the leadframes at elevated temperatures. Adding roughness to the surface of the leadframe can further increase reliability, particularly when lead-free solder and the corresponding increased solder rem temperatures are used.

Figure 2:
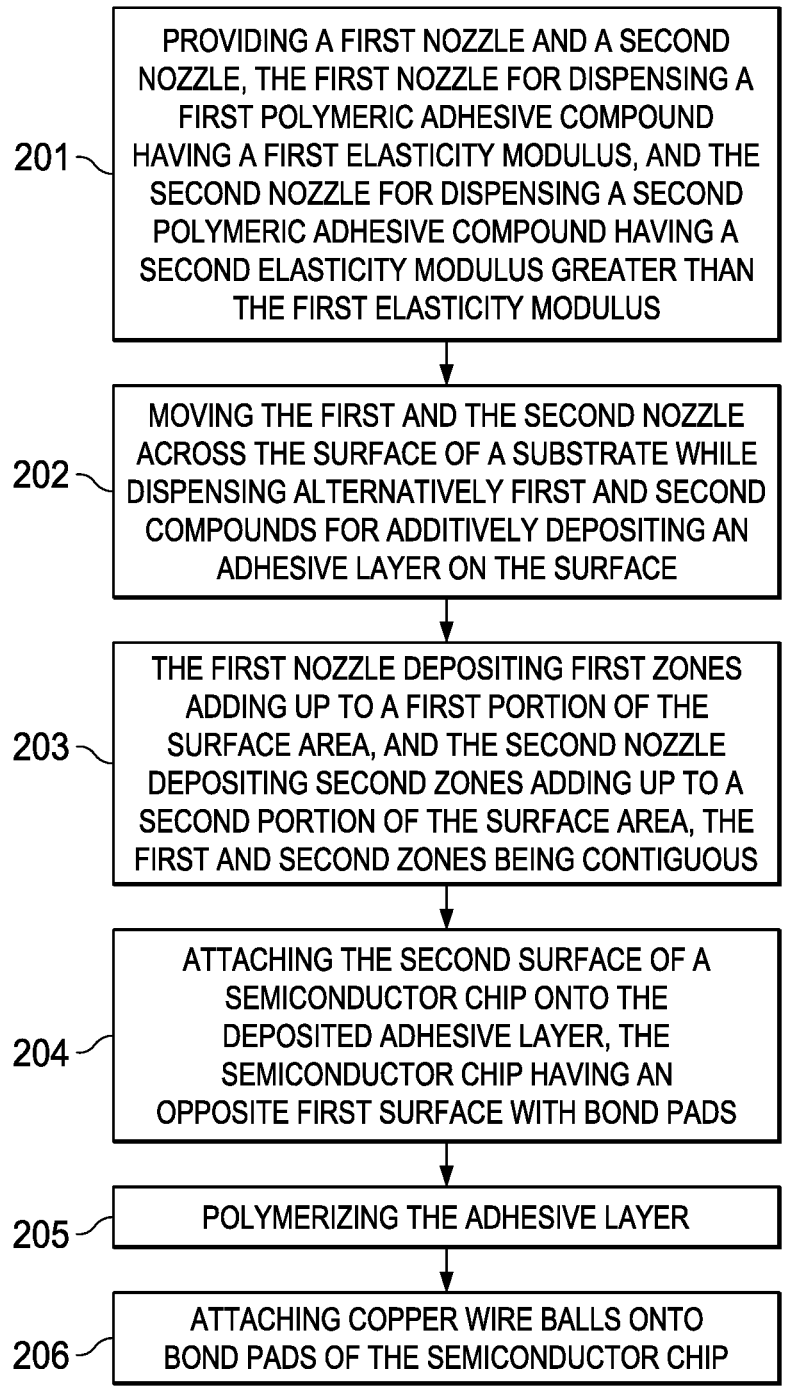
FIG. 2 is a flow diagram summarizing an embodiment process flow for creating a bi-material die attach layer.
Figure 3A:
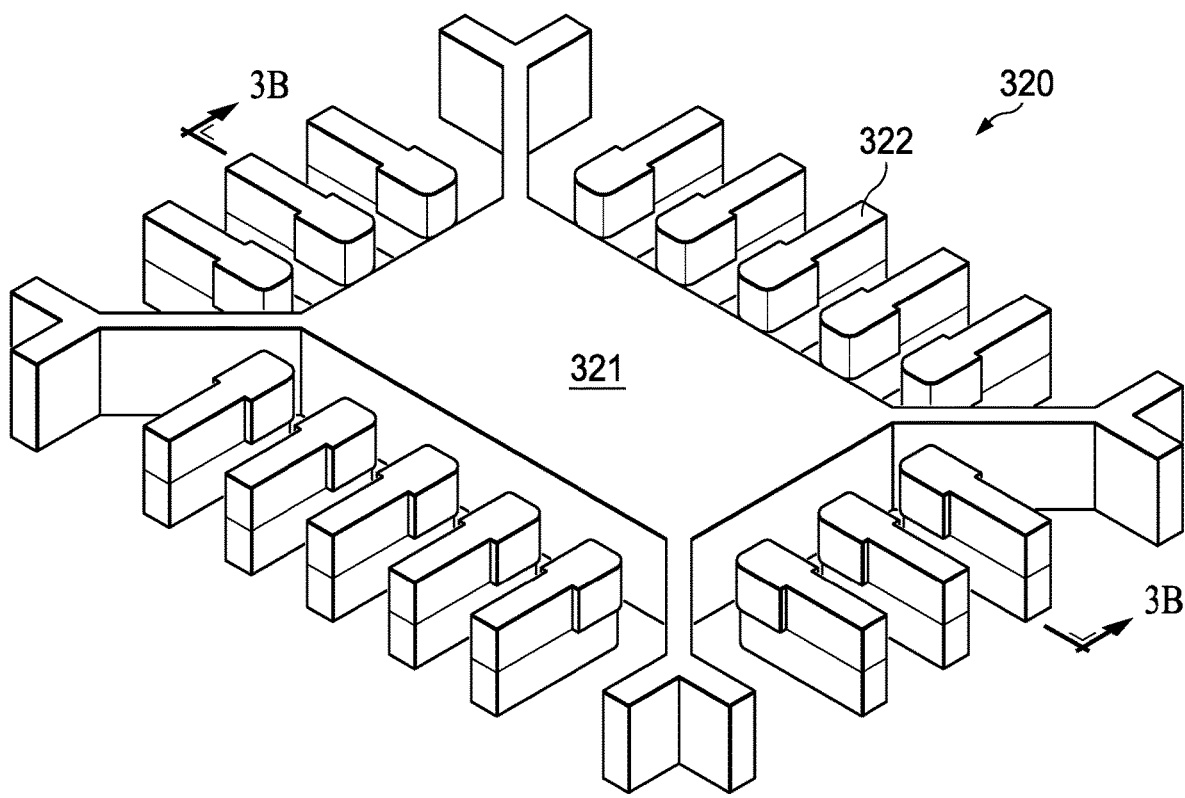
FIG. 3A depicts a perspective view of a substrate shaped as a leadframe.
Figure 3B:
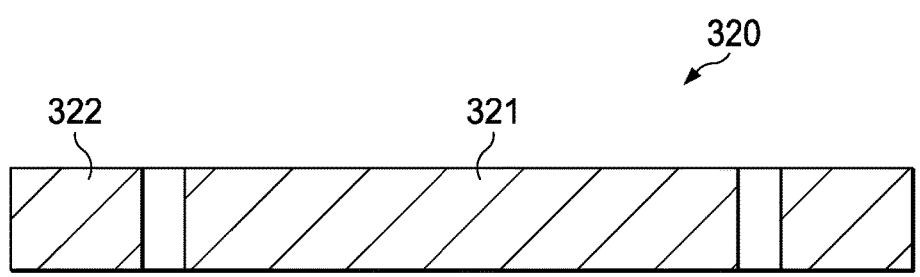
FIG. 3B shows a cross section of the leadframe of FIG. 3A.
Figure 4A:
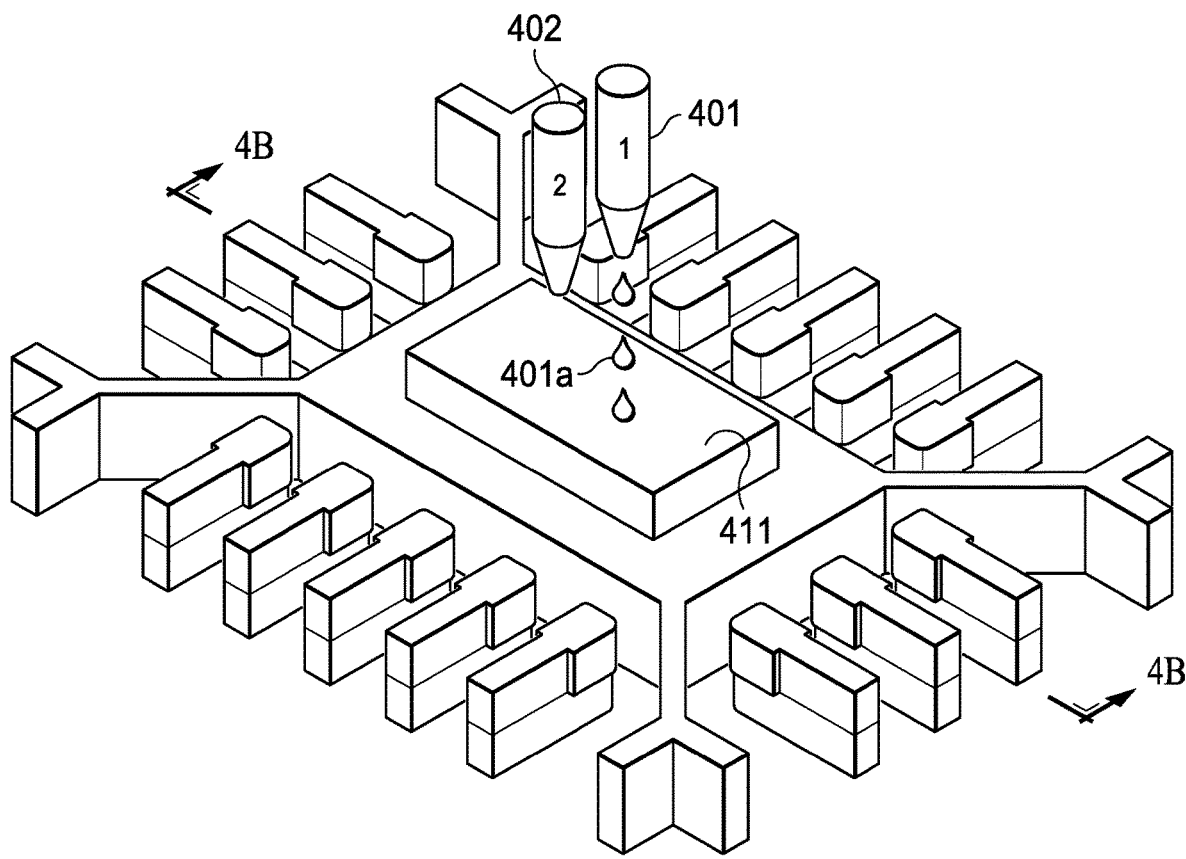
FIG. 4A illustrates a perspective view of the process of forming an additive layer of a first polymeric compound on the leadframe of FIG. 3A.

Referring now to the process flow of FIG. 2, during step 201 of the process flow and illustrated in FIG. 4A, equipment for dispensing polymeric adhesive compounds is provided. In this example embodiment of FIG. 4A, the equipment includes a computer-controlled inkjet printer with movable first nozzle 401 and movable second nozzle 402. From the nozzles, discrete drops of the compounds can be dispensed. In one example, the first nozzle 401 dispenses a first polymeric adhesive compound having a first modulus, and the second nozzle 402 dispenses a second polymeric adhesive compound having a second modulus greater than the first modulus. In an alternative example, the first nozzle 401 dispenses a first polymeric adhesive compound including metallic fillers, and the second nozzle 402 dispenses a second polymeric adhesive compound that is free from fillers. The metallic fillers can be ones that provide electrical conductivity, thermal conductivity, or can provide both. Silver is an example filler material. Automated inkjet printers can be selected from a number of commercially available printers including piezoelectric, thermal, acoustic, and electrostatic inkjet printers. Alternatively, a customized inkjet printer can be designed to work for specific polymeric compounds in the form of pastes. In alternative embodiments, the adhesives can be applied using other equipment and methods, such as screen printing, flexographic printing, gravure printing, dip coating, and spray coating. Syringes can be used, or other dispensers can be used.

Figure 5A:
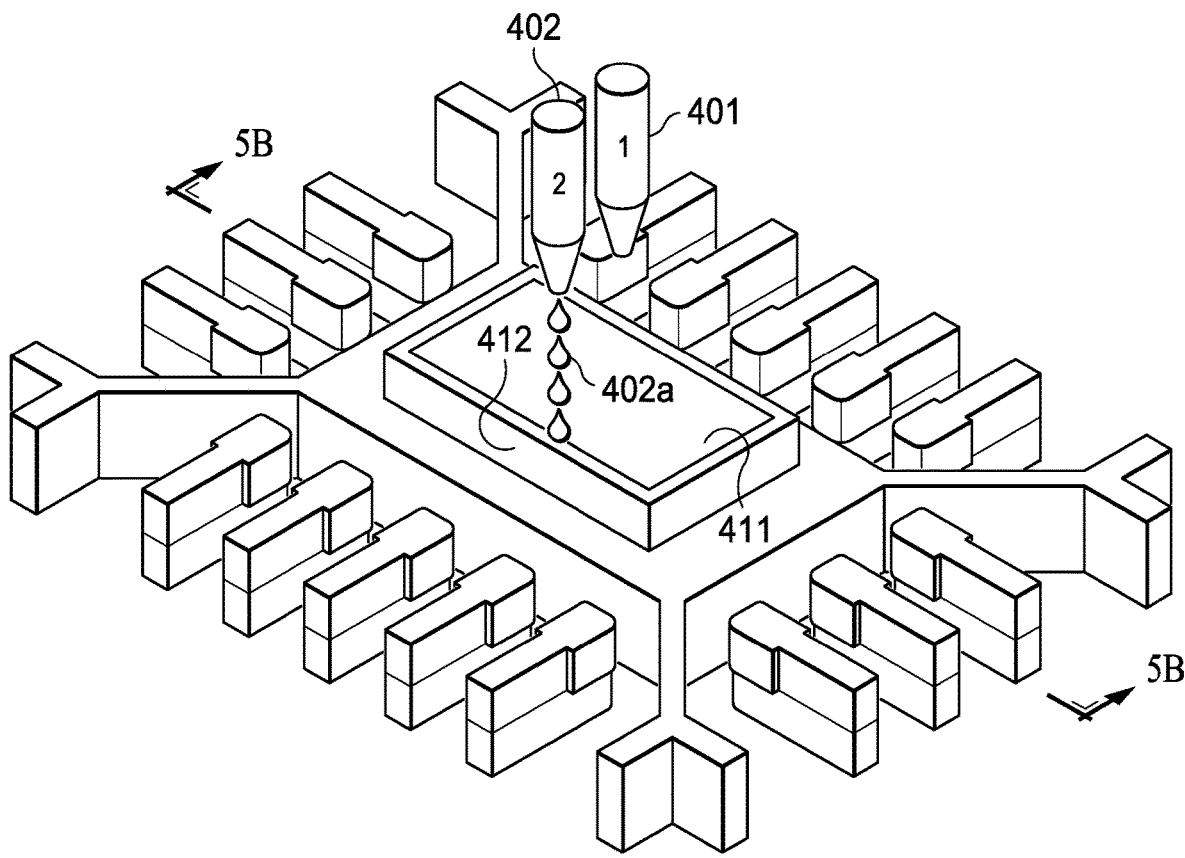
FIG. 5A shows a perspective view of the process of forming an additive layer of a second polymeric compound contiguous with the layer of the first polymeric compound.

Referring to the process flow of FIG. 2, during step 202 and illustrated in FIGS. 4A and 5A the first nozzle 401 and the second nozzle 402 are moved across the surface of substrate (leadframe) while dispensing alternatively, or simultaneously, first and second compounds for additively depositing an adhesive die attach layer on the surface of die support pad 321. In another alternative approach, the substrates can be moved relative to the nozzles while the compounds are dispensed from the nozzles. In this approach the nozzles can be fixed or can also move, the nozzles move relative to the surface of the substrate while dispensing the compounds.

Figure 4B:
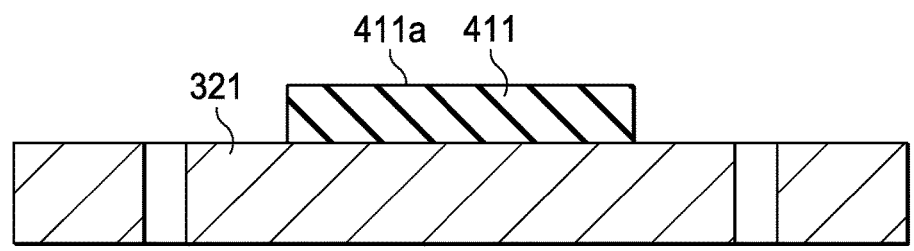
FIG. 4B depicts a cross section of the additive layer of a first polymeric compound on the leadframe of FIG. 4A.

Referring to the process flow in FIG. 2, during step 203 and illustrated in FIG. 4A the first nozzle 401 dispenses ink droplets 401a of the first polymeric compound and deposits first zones 411. The sum of first zones 411 adds up to an attach layer covering a first portion of the surface area corresponding to die surface 101b in FIG. 1. FIG. 4A shows that the first portion is shaped as a rectangle. The attach layer of the first portion has a low modulus at the temperature of wire ball bonding compared to the high modulus of the second polymeric compound. FIG. 4B depicts a cross section of die support pad 321 with the deposited the first zones 411, which are shown to have a flat surface 411a.

Figure 5B:
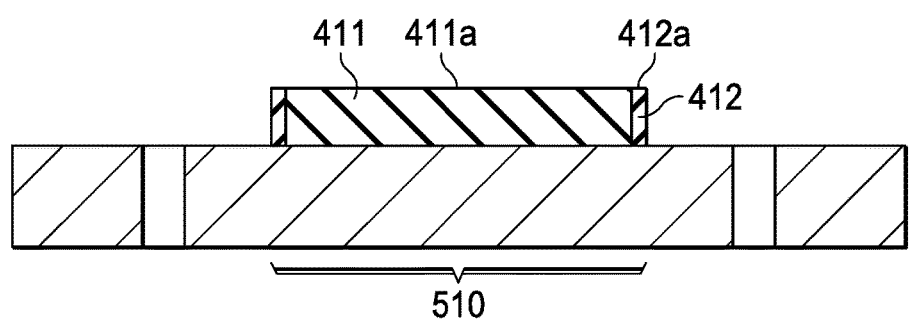
FIG. 5B illustrates a cross section of the additive layer of a second polymeric compound contiguous with the layer of the first polymeric compound.

In further action during process step 203 and illustrated in FIG. 5A, the second nozzle 402 dispenses ink droplets 402a of the second polymeric compound and deposits second zones 412. The sum of second zones adds up to an attach layer covering a second portion of the area constituted by die surface 101b (see FIG. 1) surface area, the first and second zones being contiguous. FIG. 5A shows that the second portion is shaped as a frame surrounding the rectangle of first portion 411. The cross section of FIG. 5B shows the complete deposited bi-material die attach layer 510 and indicates that the surfaces 412a of second zones 412 are coplanar with the surface 411a of the first zone 411. (FIGS. 8 to 14 display a compilation of other configurations of bi-material die attach layers where the first and second zones are arranged in various alternative ways.)

Figure 6A:
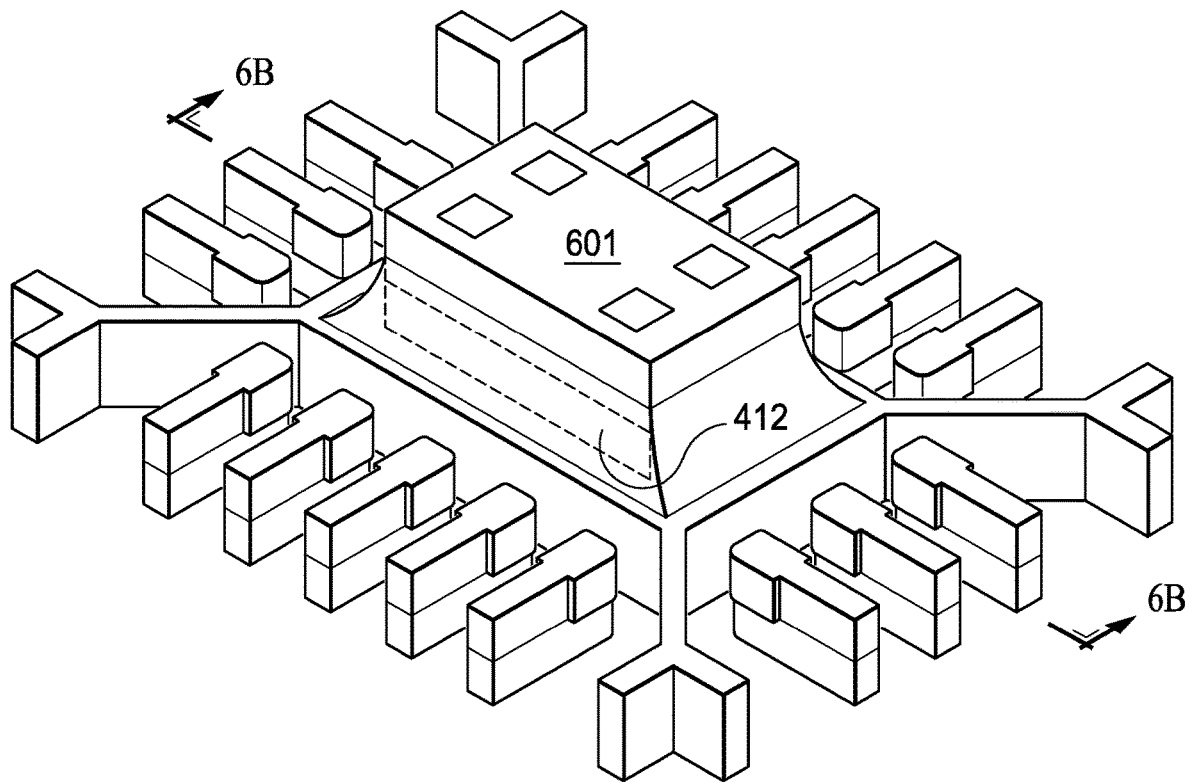
FIG. 6A depicts a perspective view of the process of attaching a workpiece shaped as a semiconductor die to the additive bi-material layer of the first and second polymeric compounds.
Figure 6B:
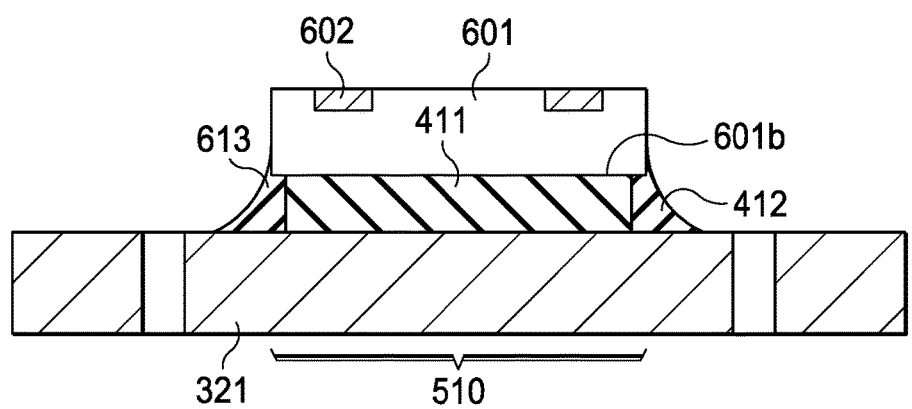
FIG. 6B shows a cross section of the semiconductor die attached to the additive bi-material layer on the leadframe.
Figure 7:
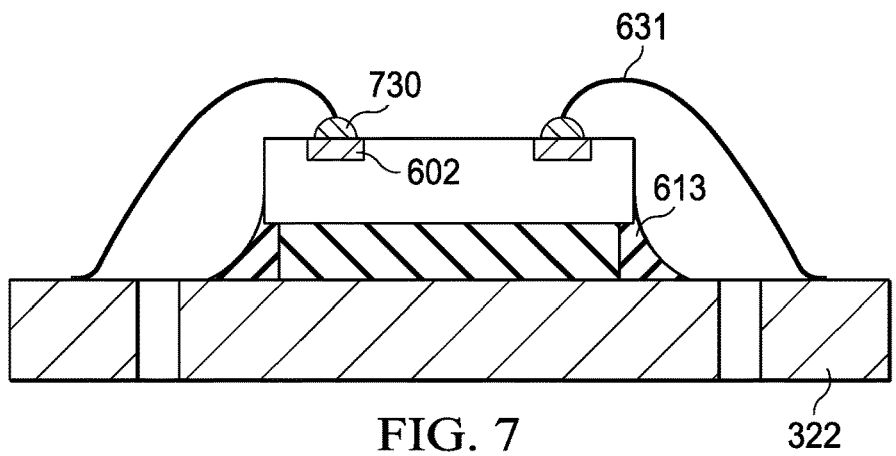
FIG. 7 illustrates a cross section of wire ball bonds interconnecting the semiconductor die and the leads of the leadframe.

During step 204 of the process flow of FIG. 2 and illustrated in FIGS. 6A and 6B, the second surface 601b (opposite the first surface 601a with bonding pads 602) of a semiconductor die 601 is attached onto the deposited adhesive layer 510. During the die attaching process, slight mechanical pressure exerted on the die squeezes bi-material die attach layer 510 so that a small amount of the second polymeric compound in second zone 412 is squeezed outward, forming a meniscus 613 stretching from die support pad 321 upward to some height along the die sidewalls. Meniscus 613 is observable by visual inspection and can therefore be used as a means of process control. FIG. 6B depicts the corresponding and matching positions of bonding pads 802 and second zones 412 made of a high modulus polymeric compound. FIG. 6B further illustrates that first zones 411 made of a low modulus polymeric compound correspond the positions of die circuitry, providing protection for stress sensitive circuits (for example, BAW devices) and other stress sensitive components such as MEMS.

During step 205 of the process flow of FIG. 2, the low modulus and high modulus polymeric compounds used for the bi-material die attach layer 510 are polymerized (cured). During step 206 of the process flow of FIG. 2 and illustrated in FIG. 7, copper wire bonding is performed by attaching copper free air balls 730 to bonding pads 602 and stich bonds of copper wire 631 to leadframe leads 322. In another example embodiment, flip chip connections can be used instead of wire bonding the die bonding pads to make electrical connection to the leadframe leads. In still further example embodiments, wire bonding using wire materials other than copper can be used.

As shown in FIG. 1, the last step of the process flow is the encapsulation of the semiconductor die 101, the bonding wires 131, and portions of the bi-material die attach layer 110 and the leadframe 120 in a packaging material 140 to form a packaged integrated circuit. In an example embodiment, the packaging material is an epoxy-based thermoset compound suitable for transfer molding technology; in a particular example the molding compound has about 90% inorganic fillers. Other molding compounds suitable for semiconductor packages can be used.

FIGS. 8 to 14 illustrate views obtained by parallel lapping through a variety of adhesive layers used in varying embodiments for semiconductor devices to attach semiconductor dies to substrates. Each of FIGS. 8-14 includes an assembly pad of a substrate, preferably a metallic leadframe; the pads are designated 821, 921, etc. On the assembly pad, the bi-material adhesive layers are deposited as described hereinabove in an example process, the adhesive layers are deposited from nozzles using inkjet printers. Each adhesive layer includes first zones composed of a first polymeric compound and second zones composed of a second polymeric compound; as mentioned hereinabove, the first polymeric compound has a first modulus and the second polymeric compound has a second modulus greater than the first modulus. The first zones are designated 811, 911, etc., and the second zones are designated 812, 912, etc. The zones of the second polymeric compound are configured to mirror image and counterbalance any bonding pads on the opposite die surface. In each device of FIGS. 8 to 14, the sum of the first zones of the first polymeric compound constitute a greater portion of the attach layer than the sum of the second zones of the second polymeric compound. However, there are other example embodiments for devices where the inverse situation prevails. In these alternative embodiments, the sum of the first zones of the first polymeric compound (having a first modulus) constitute a smaller portion of the attach layer than the sum of the second zones of the second polymeric compound (having a second modulus greater than the first modulus).

Another embodiment of the present application is a device, which has a structure analogous to FIG. 1. The device can therefore employ the same designations. The device includes a semiconductor die 101 with a first surface 101a and bond pads 102, and an opposite second surface 101b attached to a substrate 120 by a bi-material die attach layer 110 covering the area of surface 101b.

Figure 8:
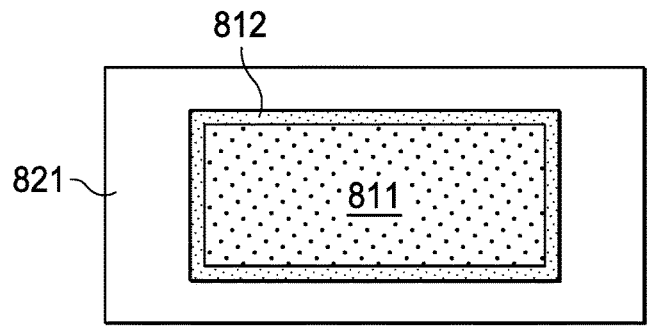
FIG. 8 shows a parallel lapping through the bi-material die attach layer of an embodiment such as the embodiment illustrated in FIG. 1.
Figure 9:
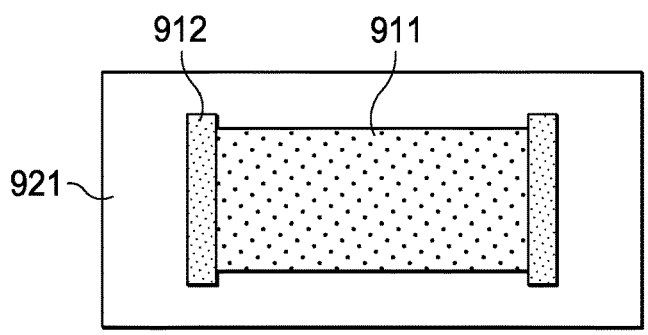
FIG. 9 displays a parallel lapping through the bi-material die attach layer of another embodiment.
Figure 10:
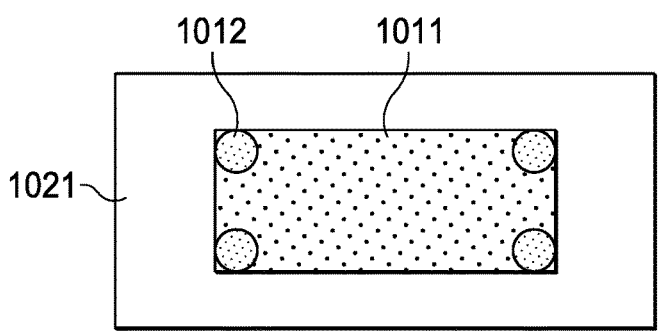
FIG. 10 illustrates a parallel lapping through the bi-material die attach layer of yet another embodiment.
Figure 11:
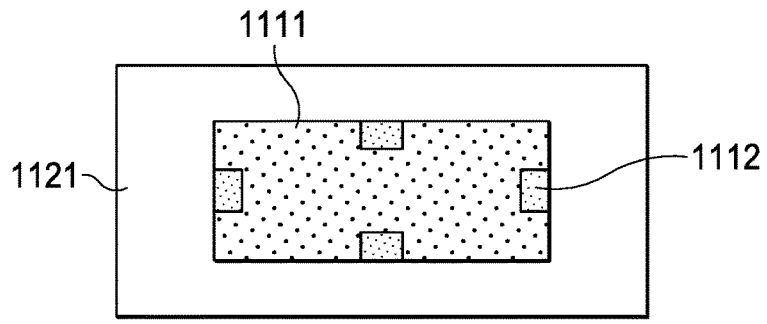
FIG. 11 illustrates a parallel lapping through the bi-material die attach layer of yet another embodiment.
Figure 12:
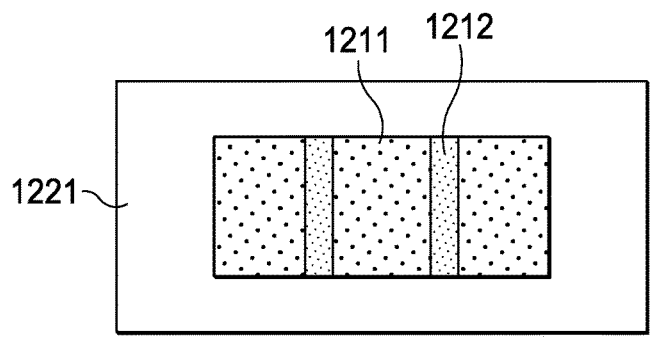
FIG. 12 shows a parallel lapping through the bi-material die attach layer of yet another embodiment.
Figure 13:
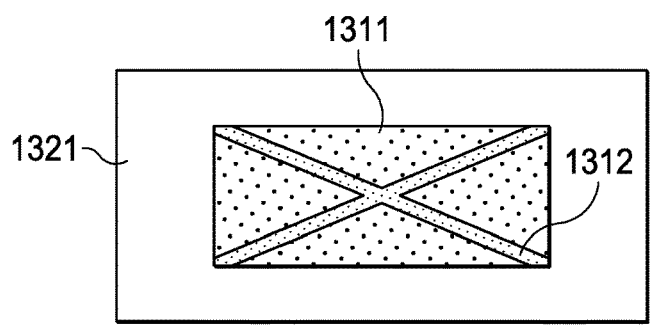
FIG. 13 displays a parallel lapping through the bi-material die attach layer of yet another embodiment.
Figure 14:
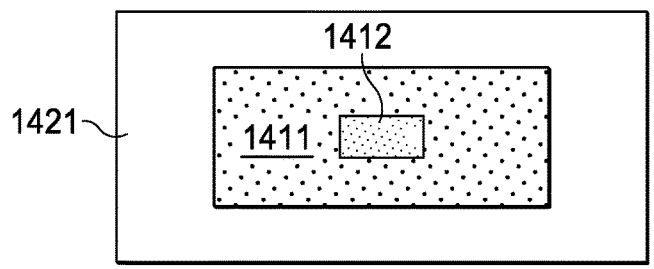
FIG. 14 illustrates a parallel lapping through the bi-material die attach layer of yet another embodiment.

The bi-material die attach layer 110 includes first zones 111 composed of a first polymeric compound and adding up to a first portion of the area of surface 101b, and second zones 112 composed of a second polymeric compound and adding up to a second portion of the surface area. The first zones 111 and the second zones 112 are contiguous. In an example embodiment, the polymers are epoxy-based compounds. As shown in FIGS. 8 and 9, the second portion of the surface area, formed by the second zones 812 and 912, respectively, can be smaller than the first portion of the surface area, formed by the second zones 112. In other embodiment devices, however, this ratio may be inversed.

In an example embodiment, the first polymeric compound includes metallic fillers and the second polymeric compound is essentially free of metallic fillers. In a particular example embodiment the metallic fillers are silver particles. Use of the silver filler in the adhesive layer results in the electrical and thermal conductivity from die 101 (see FIG. 1) to substrate 120 being enhanced. Use of the second polymeric compound that is free from filler lowers any risk of forming an electrically conductive dendrite from the die support pad 121 to a bond pad 102. In a DC electric field, for instance, between the anodic die support pad 121 and a nearby cathodic bond pad 102, a silver filled polymeric compound can undergo dissolution in the presence of moisture and thereby create positive silver ions. In the presence of an adsorbed water film acting as an electrolyte, the positive silver ions migrate in the DC electric field from the anodic die support pad 121 (see FIG. 1) to the cathodic bond pad 102. At the bond pad, the silver ions are reduced to pure silver and can eventually form a metallic dendrite tree, which can cause an electrical short between anode (die support pad 121) and cathode (bond pad 102). Consequently, in an example embodiment, the second zones (112, 812 and 912 in FIGS. 1, 8 and 9, respectively) composed of metallic filler-free compound are distributed to locations of the bi-material die attach layer (110 in FIG. 1) where a metallic dendrite from the adhesive layer to a bond pad would be likely to grow. By use of the embodiments, the growth of the metallic dendrite is reduced or prevented, reducing the risk of these electrical shorts.

For devices that include stress-sensitive circuitry and which need enhanced protection against thermos-mechanical stress, it is advantageous to select the first polymeric compound with a first modulus and the second polymeric compound with a second modulus greater than the first modulus.

Another embodiment addresses the needs of devices which have circuitry requiring an adhesive layer having different thermal conductivities, electrical conductivities, or both. Such devices have a structure analogous to FIG. 1 and can, therefore, employ the same designations. The device includes a semiconductor die 101 with a first surface 101a and bond pads 102, and an opposite second surface 101b attached to a substrate 120 by bi-material die attach layer 110 covering the area of surface 101b. The bi-material die attach layer 110 includes first zones 111 composed of a first polymeric compound and adding up to a first portion of the area of surface 101b, and second zones 112 composed of a second polymeric compound and adding up to a second portion of the surface area. The first zones 111 and the second zones 112 are contiguous. In an example embodiment, the polymers are epoxy-based compounds. As shown in FIGS. 8 and 9, the second portion of the surface area, formed by the second zones 812 and 912, respectively, can be smaller than the first portion of the surface area, formed by the second zones 112. In other embodiment devices, however, the ratio may be inversed.

In an example embodiment, the first polymeric compound includes a first thermal conductivity and the second polymeric compound a second thermal conductivity less than the first conductivity. The different thermal conductivities may be achieved by different polymeric formulations and by different admixtures to the polymeric material. In another example embodiment, the first polymeric compound includes a first electrical conductivity and the second polymeric compound a second electrical conductivity less than the first electrical conductivity. The different electrical conductivities may be achieved by different polymeric formulations and by different admixtures to the polymeric material. In yet another example embodiment, the first polymeric compound includes both a first thermal conductivity and a first electrical conductivity, and the second polymeric compound includes both a second thermal conductivity less than the first thermal conductivity, and a second electrical conductivity less than the first electrical conductivity.

For devices that include the above-mentioned conductivity-sensitive circuitry and which in addition include stress-sensitive circuitry where enhanced protection against thermo-mechanical stress is desirable, it is advantageous to select the first polymeric compound not only with the feature of a first thermal conductivity or a first electrical conductivity, but in addition with the feature of a first modulus. The second polymeric compound is then selected not only with the feature of a second thermal conductivity less than the first conductivity, or of a second electrical conductivity less than the first electrical conductivity, but also the feature of a second modulus greater than the first modulus.

While various illustrative embodiments have been described, use of the examples in this description is not intended to be construed in a limiting sense. Various modifications and combinations of the illustrative embodiments, as well as other embodiments, will be apparent upon reference to the description.

As an example, in semiconductor technology, the embodiments apply not only to active semiconductor devices with low and high pin counts, such as transistors and integrated circuits, but also to combinations of active and passive components mounted on a leadframe pad.

As another example, the embodiments apply not only to silicon-based semiconductor devices, but also to devices using gallium arsenide, gallium nitride, silicon germanium, and any other semiconductor material employed in industry.

The embodiments apply to leadframes with cantilevered leads and to QFN and SON type leadframes.

As another example, the embodiments apply to laminated substrates and any other substrate or support structure that is to be bonded to a non-metallic body.

Modifications are possible in the described embodiments, and other embodiments are possible, within the scope of the claims.

What is claimed is:

1. A device comprising:
a semiconductor die having a first surface with bond pads and an opposite second surface attached to a substrate by an adhesive layer covering at least a portion of a surface area of the second surface;
the adhesive layer including a first zone composed of a first polymeric compound and having an outer perimeter, and a second zone composed of a second polymeric compound and distributed to locations outside the outer perimeter of the first zone; and
the first polymeric compound having a first modulus and the second polymeric compound having a second modulus greater than the first modulus.

2. The device of claim 1 in which the first zone adds up to a first portion of the surface area, the second zone adds up to a second portion of the surface area, and the second portion of the surface area is smaller than the first portion of the surface area.

3. The device of claim 1 in which the second zone is distributed to locations of the adhesive layer that correspond to locations of bond pads on the first surface.

4. The device of claim 1 in which the first polymeric compound further includes metallic fillers, while the second polymeric compound is essentially free of metallic fillers.

5. The device of claim 4 in which the metallic fillers are silver particles.

6. The device of claim 5 in which the second zone are distributed to locations of the adhesive layer that correspond to locations of bond pads on the first surface.

7. A device comprising:
a semiconductor die having a first surface with bond pads and an opposite second surface attached to a substrate by an adhesive layer covering at least a portion of a surface area of the second surface;
the adhesive layer including a first zone composed of a first polymeric compound and having an outer perimeter, and a second zone composed of a second polymeric compound and distributed to locations outside the outer perimeter of the first zone; and
the first polymeric compound having including metallic fillers and the second polymeric compound being substantially free from metallic fillers.

8. The device of claim 7 in which the first zone adds up to a first portion of the surface area, the second zone adds up to a second portion of the surface area, and the second portion of the surface area is smaller than the first portion of the surface area.

9. The device of claim 7 in which the second zone are distributed to locations of the adhesive layer that correspond to locations of bond pads on the first surface.

10. The device of claim 7 in which the first polymeric compound has a first modulus and the second polymeric compound has a second modulus greater than the first modulus.

11. A device, comprising:
a semiconductor die having a first surface with bond pads and an opposite second surface attached to a substrate by an adhesive layer covering an area of the second surface;
the adhesive layer including a first zone comprising a first polymeric compound and having an outer perimeter, and including a second zone comprising a second polymeric compound and distributed to locations outside the outer perimeter of the first zone; and
the first polymeric compound having a first conductivity and the second polymeric compound having a second conductivity that is less than the first conductivity.

12. The device of claim 11, in which the first and second conductivity are thermal conductivities.

13. The device of claim 11, in which the first and second conductivity are electrical conductivities.

14. The device of claim 11, in which the first polymeric compound has a first modulus and the second polymeric compound has a second modulus that is greater than the first modulus.

15. The device of claim 11, in which the first polymeric compound includes metallic fillers, and the second polymeric compound is essentially free from metallic fillers.

* * * * *